United States Patent

Machida et al.

[11] Patent Number: 5,972,780
[45] Date of Patent: Oct. 26, 1999

[54] THIN FILM FORMING APPARATUS AND METHOD

[75] Inventors: Katsuyuki Machida, Kanagawa; Hakaru Kyuragi, Tokyo; Hideo Akiya; Kazuo Imai, both of Kanagawa, all of Japan

[73] Assignee: Nippon Telegraph Telephone Corporation, Tokyo, Japan

[21] Appl. No.: 08/911,845

[22] Filed: Aug. 15, 1997

[30] Foreign Application Priority Data

| Aug. 22, 1996 | [JP] | Japan | 8-221028 |
| Oct. 30, 1996 | [JP] | Japan | 8-288008 |
| Mar. 4, 1997 | [JP] | Japan | 9-048899 |
| Mar. 4, 1997 | [JP] | Japan | 9-048923 |
| Jul. 2, 1997 | [JP] | Japan | 9-176715 |

[51] Int. Cl.$^6$ .......................... H01L 21/30; H01L 21/46
[52] U.S. Cl. .......................... 438/455; 438/458; 438/459
[58] Field of Search .......................... 438/455, 458, 438/459

[56] References Cited

U.S. PATENT DOCUMENTS

| 5,273,938 | 12/1993 | Lin et al. . | |
| 5,286,335 | 2/1994 | Drabik et al. | 438/455 |
| 5,324,687 | 6/1994 | Wojnarowski . | |
| 5,374,564 | 12/1994 | Bruel | 438/455 |
| 5,387,551 | 2/1995 | Mizoguchi et al. | 438/455 |
| 5,656,548 | 8/1997 | Zavracky et al. | 438/455 |

FOREIGN PATENT DOCUMENTS

4-356997  12/1992  Japan .

OTHER PUBLICATIONS

K. Sato, S. Harada, A. Saiki, T. Kitamura, T. Okubo, and K. Mukai, "A Novel Planar Multilevel Interconnection Technology Utilizing Polymide", IEEE Trans. Part Hybrid Package., PHP–9, 176 (1973).

P. Elikins, K. Reinhardt, and R. Layer, "A planarization process for double metal CMOS using Spin–on Glass as a sacrficial layer," Proceeding of 3rd International IEEE VMIC Conf., 100 (1986).

K. Ehara, T. Morimoto, S. Muramoto, and S. Matsuo, "Planar Interconnection Technology for LSI Fabrication Utilizating Lift–off Process", J.Electochem Soc., vol. 131, No. 2,419 (1984).

C. Y. Ting, V. J. Vivalda, and H. G. Schaefer, "Study of Planarized Sputter–Deposited–$SiO_2$", J. Vac. Sci. Technol. 15, 1105(1978).

K. Machida and H. Oikawa, "$SiO_2$ Planarization Technology With Biasing and Electron Cyclotoron Resonance Plasma Deposition for Submicron Interconnections", J. Vac. Sci. Technol. B4, 818 (1986).

W. J. Patrick, W. L. Guthrie, C. L. Standley, P. M. Schiable, "Application of Chemical Mechanical Polishing to the Fabrication of VSLI Circuit Interconnections", J. Electrochem. Soc., vol. 138, No. 6, Jun., 1778 (1991).

*Primary Examiner*—Kevin M. Picardat
*Assistant Examiner*—D. Mark Collins
*Attorney, Agent, or Firm*—Blakey Sokoloff Taylor & Zafman

[57] ABSTRACT

A thin film forming apparatus includes a specimen holder on which a substrate for thin film formation is placed, a transfer plate opposing the specimen holder, on which a sheet film having a thin film formed on a surface is placed, a thin film forming chamber comprising the specimen holder and the transfer plate, a pressure unit for moving at least one of the specimen holder and the transfer plate and pressing the specimen holder against the transfer plate for a predetermined time while the substrate and the thin film formed on the sheet film are in contact with each other, a heating unit for heating the substrate at a predetermined temperature, and an exhausting unit for vacuum-exhausting the thin film forming chamber.

10 Claims, 11 Drawing Sheets

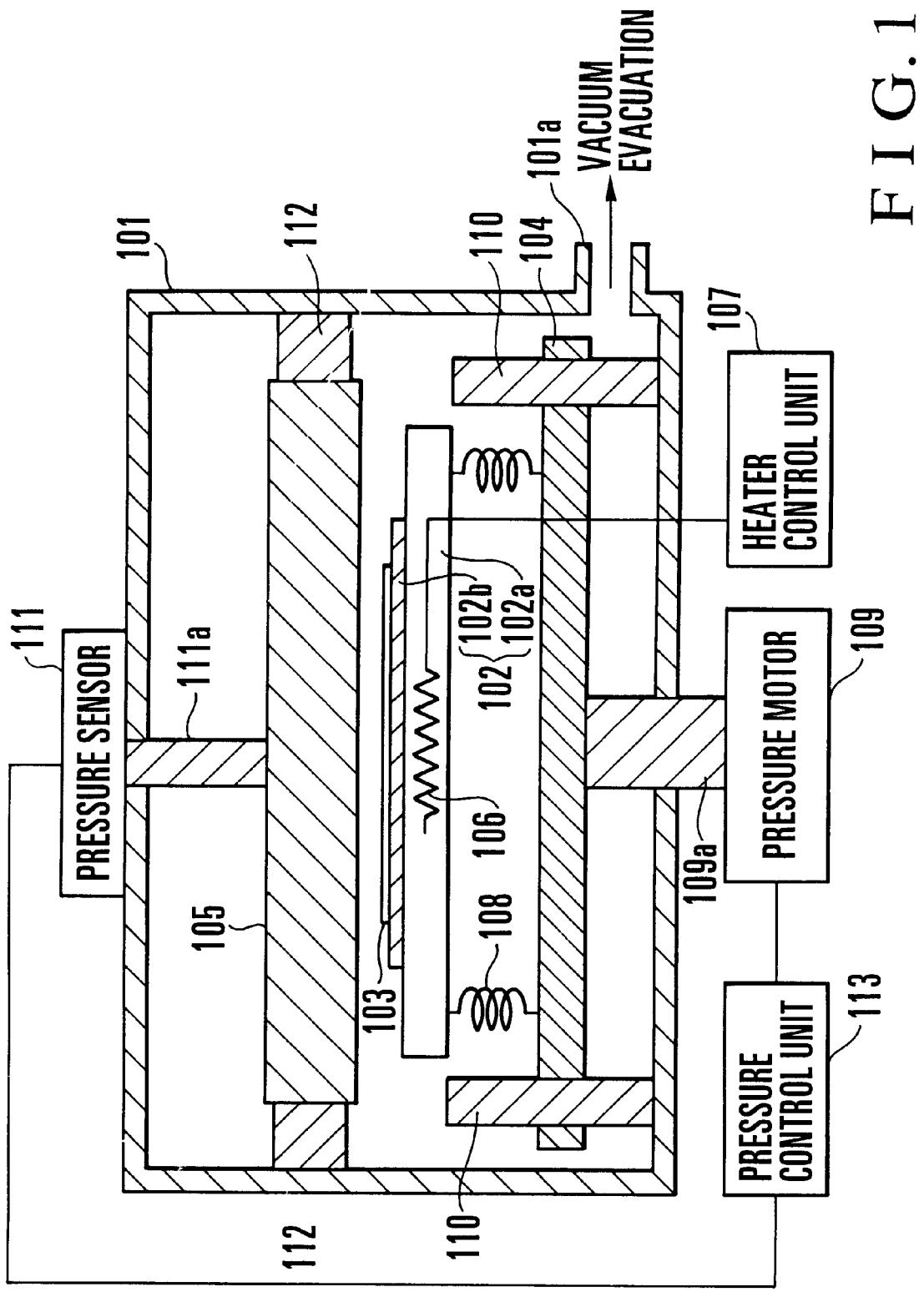
F I G. 1

THIN FILM FORMING APPARATUS AND METHOD

BACKGROUND OF THE INVENTION

The present invention relates to a thin film forming apparatus and, more particularly, to a thin film forming apparatus and method for forming a flat thin film by transferring a thin film to a substrate.

Thin film forming methods associated with electronic components can be roughly classified into sputtering, chemical vapor deposition, deposition, coating, plating, and the like. When a substrate for thin film formation has a small area, any one of the above methods can be selected to almost cope with a desired electronic component.

In recent years, however, the wafer size is steadily increasing from, e.g., 8 inches to 12 inches. Along with the increase in size of wafers used for the manufacture of LSIs or size of liquid crystal panels, demand for a thin film forming method suitable to large-size substrates has arisen.

In the field of multilevel interconnections in LSI manufacturing technologies, the surface of a dielectric film must be precisely planarized to realize a multilevel interconnection. Accordingly, demand not only for a technique coping with a large-size substrate but also for a planarization technique in thin film formation is increasing.

The followings have been examined as representative planarization techniques.

(1) SOG (Spin-On-Glass) or PIQ method (K. Sato, S. Harada, A. Saiki, T. Kitamura, T. Okubo, and K. Mukai, "A Novel Planar Multilevel Interconnection Technology Utilizing Polyimide", IEEE Trans. Part Hybrid Package., PHP-9, 176 (1973))

(2) Etch back method (P. Elikins, K. Reinhardt, and R. Layer, "A Planarization Process for Double Metal CMOS Using Spin-on Glass as a Sacrificial Layer", Proceeding of 3rd International IEEE VMIC Conf., 100 (1986))

(3) Lift off method (K. Ehara, T. Morimoto, S. Muramoto, and S. Mastuo, "Planar Interconnection Technology for LSI Fabrication Utilizing Lift-off Process", J. Electrochem. Soc., Vol. 131, No. 2, 419 (1984))

However, the SOG method utilizes the fluidity of a film and therefore can hardly realize perfect planarization.

The etch back method is the most popular technique. However, dust produced upon simultaneously etching a resist and a dielectric film is difficult to manage.

The lift off method has not been put into practice yet because the controllability or yield is insufficient due to a problem that, e.g., a stencil used cannot be completely dissolved and lifted off.

As a simple planarization technique, a bias-sputter method was proposed by C. Y. Ting et al. in 1978 (C. Y. Ting, V. J. Vivalda, and H. G. Schaefer, "Study of Planarized Sputter-Deposited-$SiO_2$", J. Vac. Sci. Technol. 15, 1105 (1978)).

In addition, as a method applied to an interconnection using bias application, a bias ECR method was proposed by K. Machida et al. in 1986 (K. Machida and H. Oikawa, "$SiO_2$ Planarization Technology with Biasing and Electron Cyclotron Resonance Plasma Deposition for Submicron Interconnections", J. Vac. Sci. Technol. B4, 818 (1986)).

In these methods, a film is formed by sputtering or ECR plasma CVD. An rf bias is applied to the substrate to cause sputtering on a substrate holder. While etching a convex region using the dependency on angle, a film is formed and planarized.

The advantages of these techniques are that a high-quality thin film can be formed even at a low temperature, and the planarization process is simple and can be easily performed.

However, they also have disadvantages such as a low throughput and damage to the device.

In 1990s, chemical mechanical polishing is proposed as a method of planarizing an interlayer dielectric (W. J. Patrick, W. L. Guthrie, C. L. Standley, P. M. Schiable, "Application of Chemical Mechanical Polishing to the Fabrication of VLSI Circuit Interconnections", J. Electrochem. Soc., Vol. 138, No. 6, June 1778 (1991)).

The chemical mechanical polishing method has received a great deal of attention because it can obtain a satisfactory planarity. However, when a dielectric film has no satisfactory characteristics, no satisfactory polishing characteristics can be obtained. Accordingly, a high-quality dielectric film must be formed at a low temperature, and polishing characteristics are unstable, resulting in disadvantages.

As described above, when any one of the prior arts is applied to a large-size semiconductor substrate, the surface planarity or uniform thin film characteristics can hardly be ensured from the viewpoint of controllability. Consequently, complicated processes must be added to cope with the large-size substrate to result in an increase in cost.

SUMMARY OF THE INVENTION

The present invention has been made in to solve the above conventional problems, and has as its principal object to provide a thin film forming apparatus and method capable of easily forming a thin film having a high planarity on a large-size wafer at a low cost by transferring a thin film formed on a sheet film to the substrate.

In order to achieve the above object, according to the first aspect of the present invention, there is provided a thin film forming apparatus comprising a specimen holder on which a substrate for thin film formation is placed, a transfer plate opposing the specimen holder, on which a sheet film is placed, the sheet film having, on a surface, a thin film to be formed on the substrate, a heating unit for heating the substrate at a predetermined temperature, a pressure unit for moving at least one of the specimen holder and the transfer plate and pressing the specimen holder against the transfer plate for a predetermined time while the substrate and the thin film formed on the sheet film are in contact with each other, a thin film forming chamber comprising the specimen holder and the transfer plate, and exhausting means for vacuum-exhausting the thin film forming chamber.

With this arrangement, the thin film formed on the sheet film is transferred to the surface of the substrate. A thin film having a high planarity can be easily formed even on a large-size substrate at a low cost.

According to the second aspect of the present invention, one of the specimen holder and the transfer plate is arranged to oppose the other at a tilt, and when the specimen holder is pressed against the transfer plate by the pressurizing means, the substrate and the thin film start to contact at the predetermined position, and the contact area extends in the predetermined direction.

With this arrangement, a gas generated from the thin film to be transferred can be removed in one direction, so that a transfer failure due to stagnation of the gas between the substrate and the sheet film can be prevented.

It is another object of the present invention to provide a thin film forming apparatus and method capable of preventing a transfer failure due to deflection of the sheet film to easily ensure the planarity and uniform thin film characteristics of the thin film.

In order to achieve the above object of the present invention, according to the third aspect of the present invention, there is provided a thin film forming apparatus comprising a sheet film supporting system for supporting, between the specimen holder and the transfer plate, the sheet film having the thin film formed on a surface thereof while directing the surface having the thin film toward a thin film formation surface of the substrate and applying a tensile force to the sheet film, and wherein the transfer plate contacts a rear surface of the sheet film.

According to the fourth aspect of the present invention, there is provided a thin film forming apparatus comprising a sheet film supply unit for supplying the sheet film into the thin film forming chamber, a unit for forming a thin film on a surface of the sheet film supplied from the sheet film supply unit, a system for cutting, from the sheet film, a film portion where the thin film has been transferred, a sheet film collection system for collecting the sheet film from which the film portion has been cut after the thin film is transferred to the substrate, and a system for peeling off, from the substrate, a sheet film of the cut film portion where the thin film has been transferred to the substrate.

With this arrangement, thin films can be continuously transferred, resulting in an improvement of productivity.

According to the fifth aspect of the present invention, there is provided a thin film forming apparatus comprising a specimen holder on which a substrate for thin film formation is fixed while directing a thin film formation surface downward, a transfer plate which is arranged under the specimen holder to oppose the specimen holder and on which a sheet film is placed while directing a thin film formation surface upward, the sheet film having, on the surface, a thin film to be formed on the substrate, a thin film forming chamber comprising the specimen holder and the transfer plate, a pressure unit for moving at least one of the specimen holder and the transfer plate and pressing the transfer plate against the specimen holder for a predetermined time while the substrate and the thin film formed on the sheet film are in contact with each other, a heating unit for heating one of the substrate and the sheet film at a predetermined temperature, and exhausting means for vacuum-exhausting the thin film forming chamber.

With this arrangement, the thin film formed on the sheet film is always received the uniform downward gravity, so that the thickness of the thin film can be uniformly held.

BRIEF DESCRIPTION OF THE DRAWINGS

FIG. 1 is a view showing a thin film forming apparatus according to the first embodiment of the present invention;

FIGS. 5A to 5C are schematic views showing a thin film forming apparatus according to the third embodiment of the present invention in which FIG. 5A shows a state wherein a sheet film is placed, FIG. 5B shows a state wherein a transfer plate is brought into contact with the sheet film, and FIG. 5C shows a state wherein a substrate is pressed against the sheet film to transfer a thin film;

FIGS. 6A to 6C are schematic views showing still another embodiment of the present invention in which FIG. 6A shows a state wherein a sheet film is placed, FIG. 6B shows a state wherein a transfer plate is brought into contact with the sheet film, and FIG. 6C shows a state wherein a substrate is pressed against the sheet film;

FIGS. 7A to 7C are schematic views showing still another embodiment of the present invention in which FIG. 7A shows a state wherein a sheet film is placed, FIG. 7B shows a state wherein a transfer plate is brought into contact with the sheet film, and FIG. 7C shows a state wherein a substrate is pressed against the sheet film;

DETAILED DESCRIPTION OF THE PREFERRED EMBODIMENTS

[First Embodiment]

Figure 2:
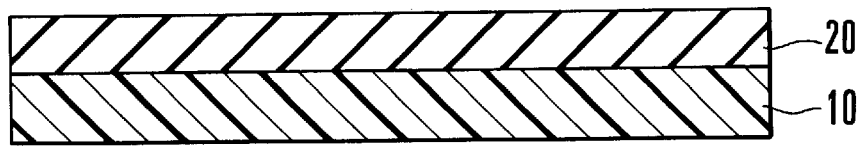
FIG. 2 is a sectional view of a sheet film on which a dielectric film is formed.

FIG. 1 shows a thin film forming apparatus according to the first embodiment of the present invention.

As shown in FIG. 1, a specimen holder 102 on which a wafer 103 is placed, a specimen holder supporting plate 104 which supports the specimen holder 102 during movement, and a transfer plate 105 opposing the specimen holder 102 are arranged in a thin film forming chamber 101 capable of being vacuum-exhausted.

The specimen holder 102 is constituted by a heating table 102a and a stage 102b consisting of quartz on which the wafer 103 is placed. Quartz contains no substances contaminating the wafer 103 and can easily obtain a necessary planarity because of its good workability, and therefore, is suitable as the material of the table (stage) on which the wafer 103 is placed.

The heating table 102a comprises a heater 106 as a heating system. The heater 106 is controlled by a heater control unit 107 within the range of 25° C. to 300° C.

The specimen holder 102 is coupled to the specimen holder supporting plate 104 with springs 108 such that a uniform pressure is applied to the specimen holder 102.

The specimen holder supporting plate 104 is arranged to apply a uniform pressure to the wafer 103 when the specimen holder 102 is moved toward the transfer plate 105 to form a thin film.

The specimen holder supporting plate 104 is connected to a pressure motor 109 arranged outside the thin film forming chamber 101 through a pressure driving unit 109a and held by columns 110 for transferring the specimen holder 102.

A pressure up to 20 kgw can be applied to the specimen holder supporting plate 104 by driving the pressure motor 109.

A sheet film on which a thin film has been formed in advance is fixed on the transfer plate 105. When the opposing specimen holder 102 is moved upward and pressed against the transfer plate 105, the pressure applied on the transfer plate 105 is detected by a pressure sensor 111 arranged on the rear surface of the transfer plate 105. The pressure measured by the pressure sensor 111 is sent to a pressure control unit 113.

The pressure control unit 113 controls the pressure motor 109 on the basis of the detection result from the pressure sensor 111 so that a pressure can be applied for a predetermined time while preventing, e.g., overpressurizing.

A polished quartz plate is arranged on the transfer plate 105 at the surface on which the sheet film is fixed, thereby ensuring a planarity. The sheet film is fixed at two ends of the quartz plate. A receiving rod 111*a* of the pressure sensor 111 is arranged at the center of the rear surface of the transfer plate 105. Supporting rods 112 of the transfer plate 105 are arranged to be symmetrical about the receiving rod 111*a*. The thin film forming chamber 101 is vacuum-exhausted by a vacuum exhausting means (not shown) through an exhaust port 101*a*.

A process of forming a thin film using the above-described thin film forming apparatus will be described next.

FIG. 2 shows the section of a sheet film on which a thin film is formed.

In this embodiment, a thermoplastic synthetic resin film was used as a sheet film 10. As a thin film, a silica-based dielectric film formation coating solution containing one or more polysilazanes as SOG materials represented by formula (1) below was used. The coating solution was applied to the sheet film 10 to form a dielectric film 20.

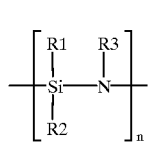

(1)

In formula (1), R1, R2, and R3 independently represent a hydrogen atom or an alkyl, aryl, or alkoxyl group having 1 to 8 carbon atoms. In this embodiment, the dielectric film 20 had a thickness of 1 $\mu$m or more.

Figure 3A:
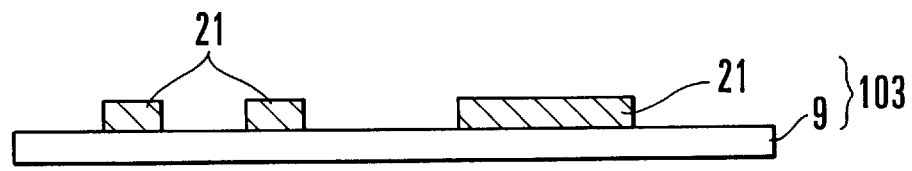
FIGS. 3A to 3D are sectional views showing a process of transferring a dielectric film to a semiconductor substrate.

FIG. 3A shows the wafer 103 on which a dielectric film is to be formed using the above-described sheet film 10.

As shown in FIG. 3A, the substrate 103 has a structure in which aluminum interconnections as electrode interconnections 21 are formed on a semiconductor substrate 9. In this embodiment, an aluminum film having a thickness of 5,000 Å was formed by sputtering and patterned by photolithography, and then dry etching was performed, thereby forming the Al interconnections 21.

In this embodiment, the wafer 103 is placed on the heating portion 102*b* of the specimen holder 102 such that the Al interconnections 21 are directed upward. The sheet film 10 is placed on the transfer plate 105 arranged above the specimen holder 102 and opposing the specimen holder 102 such that the dielectric film 20 opposes the specimen holder 102.

The operation of the thin film forming apparatus of this embodiment, which is performed when the dielectric film 20 on the sheet film 10 shown in FIG. 2 is to be transferred to the semiconductor substrate 9 on which the Al interconnections 21 are formed as shown in FIG. 3A, will be described below.

(1) The heater 106 is controlled by the heater control unit 107 to heat the wafer 103 to a desired temperature.

(2) The thin film forming chamber 101 is set to a desired degree of vacuum by a vacuum exhausting means (not shown in FIG. 1).

(3) After the desired degree of vacuum is obtained, a signal is sent from the pressure control unit 113 to the pressure motor 109 to start a pressurizing operation. With this operation, the specimen holder 102 moves toward the transfer plate 105 together with the specimen holder supporting plate 104, so that the wafer 103 and the sheet film 10 are brought into contact with each other.

Figure 3B:
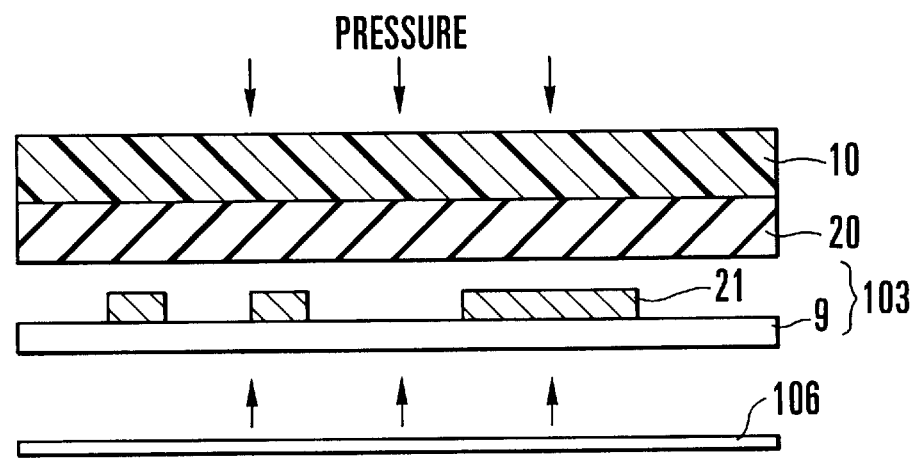

(4) Pressurizing is continuously performed by the pressure motor 109. When a desired pressure is detected by the pressure sensor 111, the pressure control unit 113 controls the pressure motor 109 to keep the pressure applied for a predetermined time (FIG. 3B).

In this embodiment, the degree of vacuum is set at 10 Torr or less. Thin film transfer is performed at a pressure of 5 kg and a temperature of 150° C. for a heating time of 10 minutes.

(5) Upon completion of the series of pressurizing operations, the pressure control unit 113 sends a signal to the pressure motor 109 to make the pressure zero. At this time, control is also performed to stop vacuum exhaust.

(6) Thereafter, the wafer 103 attached with the sheet film 10 while sandwiching the dielectric film 20 therebetween is extracted from the thin film forming chamber 101. The sheet film 10 is peeled off (FIG. 3C), thereby obtaining the semiconductor substrate 9 on which the dielectric film 20 is formed, as shown in FIG. 3D.

Figure 3C:
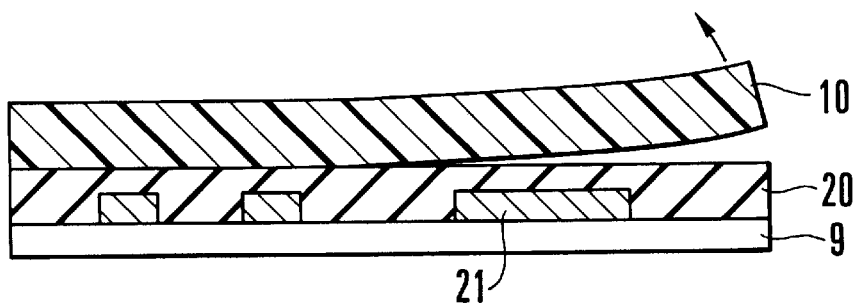
Figure 3D:
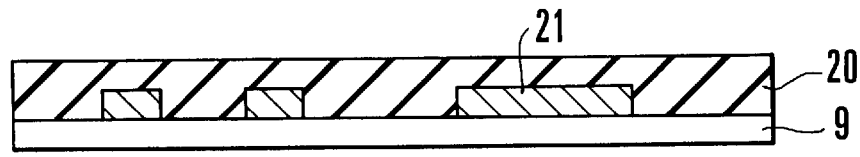

FIG. 3C shows a state wherein the sheet film 10 is being peeled off after the dielectric film 20 is transferred to the semiconductor substrate 9. FIG. 3D shows the semiconductor substrate whose surface is planarized after peel off. After peel off, the dielectric film is annealed. In this embodiment, annealing was performed in a water vapor ambient at a temperature of 400° C. for 30 minutes. The resultant dielectric film 20 had a thickness of 1.0 $\mu$m. As shown in FIG. 3D, when the apparatus of the present invention was used, a structure with a flat surface could be realized.

In the above embodiment, the present invention is applied to a semiconductor substrate. However, as far as the thin film is associated with electronic components, the present invention can be applied to a substrate associated with multi-chip-module or a liquid crystal panel.

[Second Embodiment]

Figure 4:
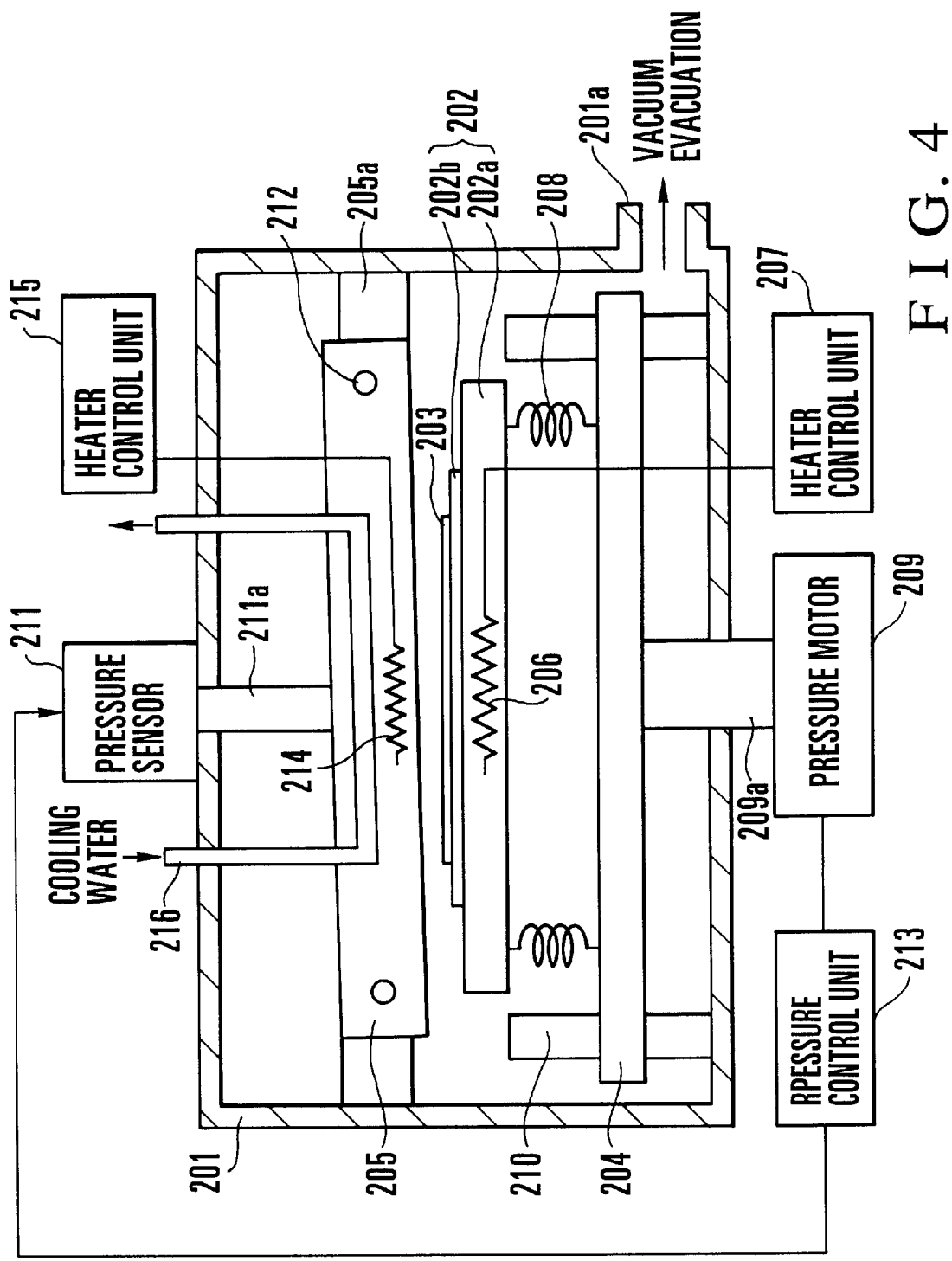
FIG. 4 is a view showing a thin film forming apparatus according to the second embodiment of the present invention.

FIG. 4 shows a thin film forming apparatus according to the second embodiment of the present invention.

As shown in FIG. 4, a specimen holder 202 on which a wafer 203 is placed, a specimen holder supporting plate 204 which supports the specimen holder 202 during movement, and a transfer plate 205 opposing the specimen holder 202 are arranged in a thin film forming chamber 201 capable of being vacuum-exhausted. The thin film forming chamber 201 is vacuum-exhausted by a vacuum exhausting means (not shown) through an exhaust port 201*a*.

The specimen holder 202 is constituted by a heating table 202*a* and a stage 202*b* consisting of quartz on which the wafer 203 is placed. Quartz contains no substances contaminating the wafer 203 and can easily obtain a necessary planarity because of its good workability, and therefore, is suitable as the material of the table (stage) on which the wafer 203 is placed.

The heating table 202*a* comprises a heater 206 as a heating system. The heater 206 is controlled by a heater control unit 207 within the range of 25° C. to 300° C.

The specimen holder 202 is coupled to the specimen holder supporting plate 204 with springs 208 such that a uniform pressure is applied to the specimen holder 202.

The specimen holder supporting plate 204 is arranged to apply a uniform pressure to the wafer 203 when the specimen holder 202 is moved toward the transfer plate 205 to form a thin film.

The specimen holder supporting plate 204 is connected to a pressure motor 209 arranged outside the thin film forming chamber 201 through a pressure driving unit 209a and held by columns 210 for translating the specimen holder 202. Although not illustrated, the columns 210 are arranged at the four corners of the specimen holder 202.

A pressure up to 20 kgw can be applied to the specimen holder supporting plate 204 by driving the pressure motor 209.

A sheet film on which a thin film has been formed in advance is fixed on the transfer plate 205. When the opposing specimen holder 202 is moved upward and pressed against the transfer plate 205, the pressure applied on the transfer plate 205 is detected by a pressure sensor 211 arranged on the rear surface of the transfer plate 205. The applied pressure is measured by the pressure sensor 111, thus preventing, e.g., overpressurizing.

A polished quartz plate is arranged on the transfer plate 205 at the surface on which the sheet film is fixed, thereby ensuring a planarity. The sheet film is fixed at two ends of the quartz plate. A receiving rod 211a of the pressure sensor 211 is arranged at the center of the rear surface of the transfer plate 205.

The transfer plate 205 is held to be not parallel but tilted with respect to the surface of the specimen holder 202. Supporting rods 212 of the transfer plate 205 are arranged to be symmetrical about the receiving rod 211a at positions separated from the specimen holder supporting table 204 by different distances. The supporting rods 212 are fixed to a transfer plate receiving plate 205a fixed in the thin film forming chamber 201. The supporting rods 212 may be directly fixed to the wall of the thin film forming chamber 201 as far as the transfer plate 205 is fixed at a tilt.

The transfer plate 205 is tilted with respect to the specimen holder 202. With this arrangement, when the specimen holder 202 is moved upward, and as shown in FIG. 4, the specimen holder 202 and the transfer plate 205 are brought into contact from the left side of the drawing, the contact area extends to the right side as the specimen holder 202 is moved upward.

As described above, the transfer plate 205 is tilted. A sheet film is placed on the surface of the transfer plate 205, and in this state, the specimen holder supporting table 204 is moved upward to press the wafer 203 on the specimen holder 202 against the sheet film. At this time, the direction of removing the gas generated between the wafer 203 and the sheet film can be kept unchanged, so that the gas can be removed in one direction.

The transfer plate 205 has a heater 214. The transfer plate 205 is heated under the control of a heater control unit 215. The heating temperature can be controlled within the range of 25° C. to 300° C.

The transfer plate 205 also has a water channel 216 so that the transfer plate 205 can be cooled by flowing cooling water in the water channel 216. The cooling temperature can be controlling within the range of 10° C. to 25° C.

When the transfer plate 205 is heated by the heating system, degassing from the thin film formed on the sheet film can be prompted, so that a transfer failure due to bubble generated upon degassing in transfer can be prevented.

The cooling system is also arranged. For this reason, by cooling the structure after transfer, local shrinkage takes place at the interface between the sheet film and the thin film. This degrades contact between the sheet film and the thin film, enabling easier peel off. In an apparatus having no cooing system, the sheet film is peeled off by spontaneous cooling. However, when the cooling system is arranged, peel off can be intentionally controlled, and the process time can be shortened.

Formation of a dielectric film using the above-described thin film forming apparatus will be described below.

The materials and structures of the sheet film used in this embodiment, the thin film (dielectric film) formed on the sheet film, and the wafer 203 are identical to those of the first embodiment.

More specifically, in this embodiment as well, a thermoplastic synthetic resin film was used as the sheet film. As the thin film (dielectric film) formed on the sheet film, a silica-based dielectric film formation coating solution containing one or more polysilazanes as SOG materials represented by formula (1) was used. As shown in FIG. 2, the coating solution was applied to the surface of a sheet film 10 to form a dielectric film 20 having a thickness of 1 μm or more.

As a purpose to which the dielectric film 20 formed on the sheet film 10 is to be transferred, a structure in which Al interconnections 21 were formed on a semiconductor substrate 9, as shown in FIG. 3A, was used.

The semiconductor substrate 9 (wafer 203 in FIG. 4) was placed on the specimen holder 202 (FIG. 4). The sheet film 10 shown in FIG. 2 was placed on the transfer plate 205 such that the surface having the dielectric film 20 opposed the specimen holder 202.

The thin film forming chamber 201 was vacuum-exhausted to 10 Torr. The transfer plate 205 was heated using the heater 214 to heat the placed sheet film 10 at 110° C. for five minutes. When the sheet film was heated under a low pressure, degassing from the dielectric film 20 formed on the sheet film 10 could be prompted and effectively performed.

By operating the pressure motor 209, the specimen holder supporting table 204 and the specimen holder 202 were moved upward. A surface of the semiconductor substrate 9, on which the Al interconnections 21 were formed, was pressed against a surface of the sheet film 10, on which the dielectric film 20 was formed. In this embodiment, the transfer plate 205 was tilted with respect to the specimen holder 202 by 20°.

The semiconductor substrate 9 was pressed against the sheet film 10 under a pressure of 5 kg, and this state was held at 150° C. for 10 minutes.

Thereafter, heating by the heater 214 was stopped, and cooling water was flowed in the water channel 216 to cool the transfer plate to about 10° C., thereby cooling the sheet film 10.

With the above process, the sheet film 10 was peeled off from the semiconductor substrate 9 in about three minutes. The dielectric film 20 formed on the sheet film 10 was transferred to the semiconductor substrate 9.

As a result, as shown in FIG. 3B, the dielectric film 20 was formed on the semiconductor substrate 9 including the Al interconnections 21.

Next, the specimen holder 202 was heated by the heater 206 to heat the semiconductor substrate 9 to about 400° C. for 30 minutes, thereby annealing the transferred dielectric film 20. At this time, annealing was performed in a water vapor ambient at a temperature of 400° C. for 30 minutes.

With this process, the surface of the dielectric film 20 was planarized. The resultant dielectric film 20 had a thickness of 1.0 μm.

In this embodiment, quartz is used for the stage on which the wafer is placed. However, the present invention is not limited to this. Any other material may be used as far as it contains no substances as prospective contamination sources from the viewpoint of wafer contamination prevention, and can be cleaned and ensure a planarity.

In the above embodiment, a pressure is applied using the motor. However, the present invention is not limited to this. Any other system can be used as far as it can apply a pressure between the transfer plate and the specimen holder.

In the above embodiment, the dielectric film is formed. However, any other thin film can also be formed.

In the above embodiment, the thin film is formed on the semiconductor substrate. However, the present invention is not limited to this and can be applied to a substrate associated with multi-chip-module or a liquid crystal panel.

[Third Embodiment]

Figure 5A:
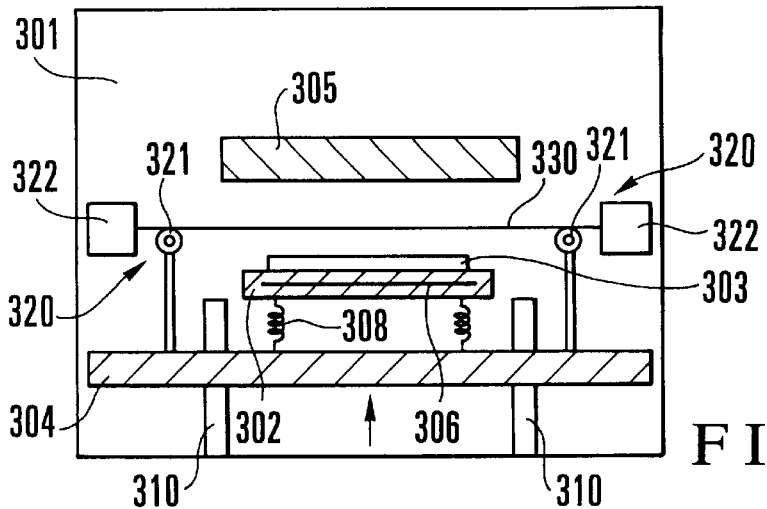
Figure 5B:
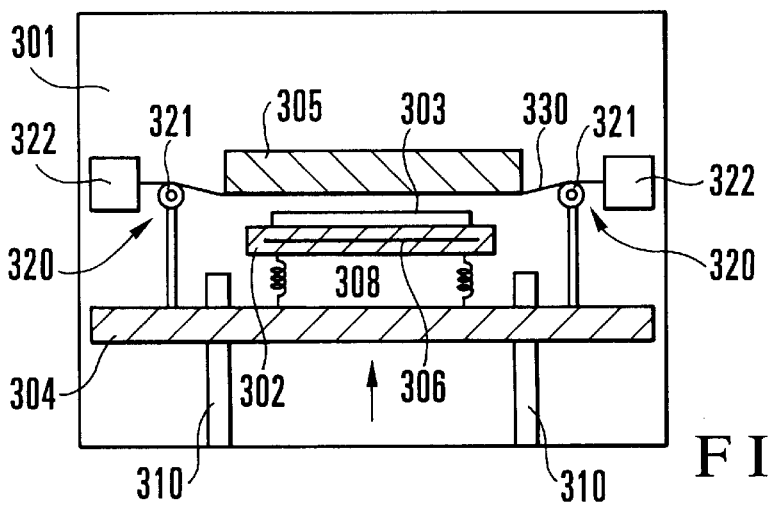
Figure 5C:
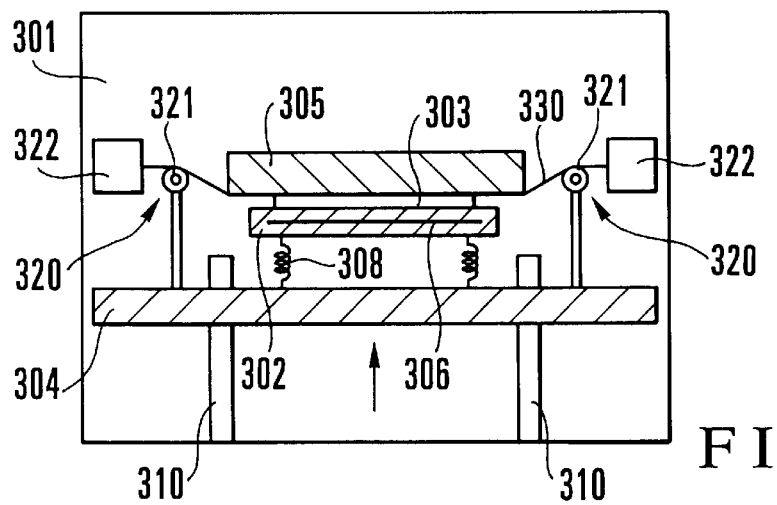

FIGS. 5A to 5D show a thin film forming apparatus according to the third embodiment of the present invention. FIG. 5A shows a state wherein a sheet film is placed. FIG. 5B shows a state wherein a transfer plate is brought into contact with the sheet film. FIG. 5C shows a state wherein a substrate is pressed against the sheet film to transfer a thin film. Referring to FIGS. 5A to 5C, the thin film forming apparatus comprises a thin film forming chamber 301, and, a specimen holder 302, a transfer plate 305, a specimen holder supporting table 304, and a sheet film supporting system 320, which are arranged in the thin film forming chamber 301.

The thin film forming chamber 301 is decompressed by a vacuum pump (not shown). The specimen holder 302 has a heating means 306 such as a heater for heating a wafer 303 as a substrate placed on the specimen holder 302, and is arranged on the specimen holder supporting table 304. The heating temperature of the heating means 306 can be controlled within the range of 25° C. to 300° C. The specimen holder supporting table 304 can be moved in the vertical direction. The specimen holder supporting table 304 is moved upward in thin film transfer. The transfer plate 305 is arranged above the specimen holder 302 and opposes the specimen holder 302 while sandwiching a sheet film 330 therebetween.

On the sheet film 330, a thin film is formed on a surface opposing the wafer 303. The two ends of the sheet film 330 are supported by rotating shafts 321 of the sheet film supporting system 320. A tension system 322 applies a predetermined tensile force to the sheet film 330 so that the sheet film 330 is kept taut. As the tension system 322, e.g., weights are suspended at the two ends of the sheet film 330. When a tensile force is applied to the sheet film 330 by the sheet film supporting system 320 having the rotating shafts 321 and the tension system 322, the sheet film 330 can be prevented from deflecting upon being heated and pressed by the transfer plate 305. In addition, the sheet film supporting system 320 is arranged on the specimen holder supporting table 304 and therefore moved in the vertical direction together with the specimen holder 302.

The specimen holder supporting table 304 is supported by columns 310 to be movable in the vertical direction. The specimen holder 302 is coupled to the specimen holder supporting table 304 with springs 309 so that the specimen holder 302 can be uniformly pressurized.

For the illustrative convenience, a heater control unit, a pressure motor, a pressure sensor, and a pressure control unit are omitted in FIGS. 5 to 7.

In the thin film forming apparatus having the above arrangement, when a thin film formed on the sheet film 330 is to be transferred to the wafer 303, the wafer 303 is placed on the specimen holder 302 first. The sheet film 330 is set above the wafer 303 while directing the surface having the thin film downward, and supported and made taut by the sheet film supporting system 320. The thin film forming chamber 301 is vacuum-exhausted to a low pressure, and the heating means 306 is heated. Next, as shown in FIG. 5B, the specimen holder supporting table 304 is moved upward to bring the lower surface of the sheet film 330 into contact with the transfer plate 305, thereby uniformly extending the sheet film 330. The specimen holder supporting table 304 is further moved upward such that the upper surface of the wafer 303 is pressed against the surface of the sheet film 330, as shown in FIG. 5C. The thin film formed on the sheet film 330 is transferred to the surface of the wafer 303. With this operation, a transfer failure due to deflection can be prevented. In addition, since the size of the sheet film 330 can be arbitrarily changed, thin film transfer to a large-size wafer 303 is enabled.

In this embodiment, a 300-g weight is used as a weight suspended on each side of the sheet film 330. Although such weights are used in this embodiment, any other system can be used in place of the weights, as far as it applies a tensile force to the sheet film 330.

Figure 6A:
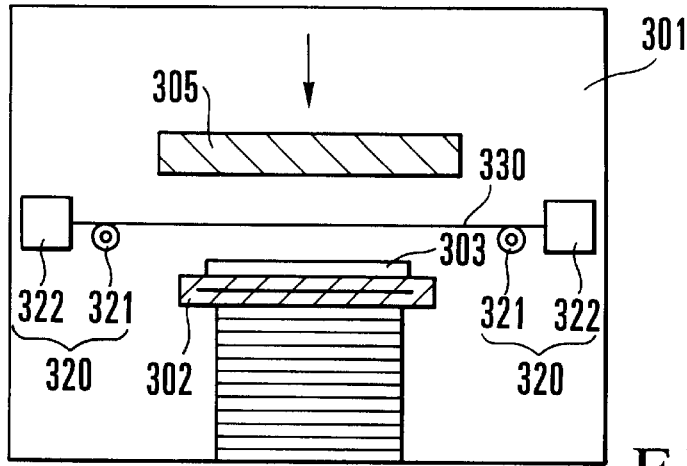
Figure 6B:
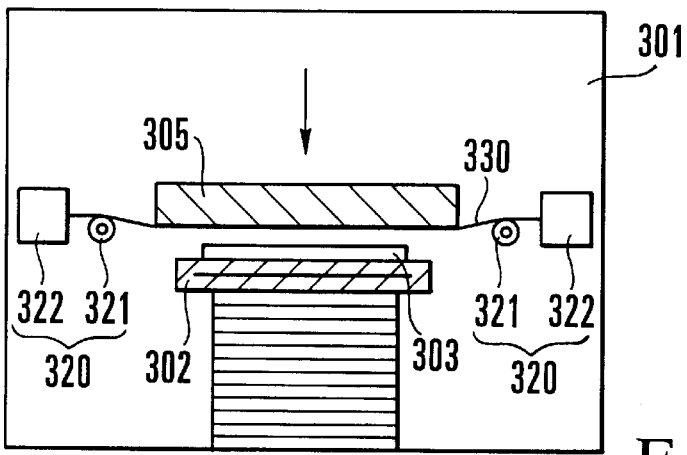
Figure 6C:
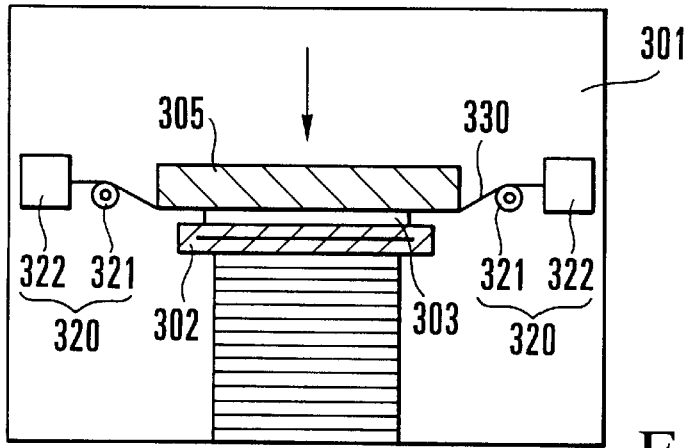

FIGS. 6A to 6C show still another embodiment of the present invention.

In this embodiment, a transfer plate 305 is arranged above a specimen holder 302 and a sheet film supporting system 320 to be movable in the vertical direction. The transfer plate 305 is moved downward to press a sheet film 330 against the upper surface of a wafer 303. With this arrangement as well, the sheet film 330 can be prevented from deflecting, as in the above embodiment.

Figure 7A:
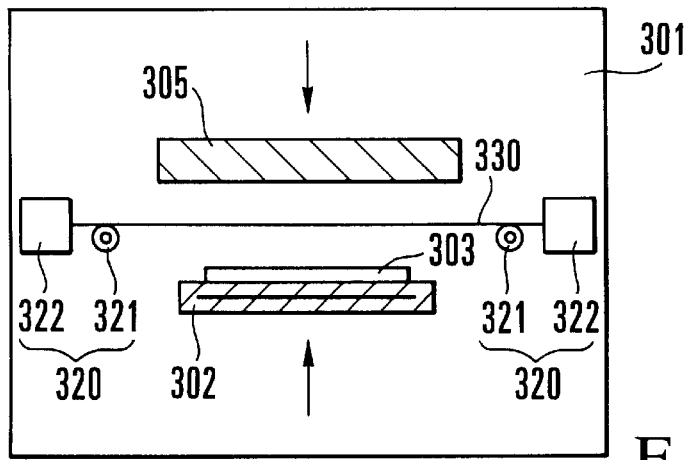
Figure 7B:
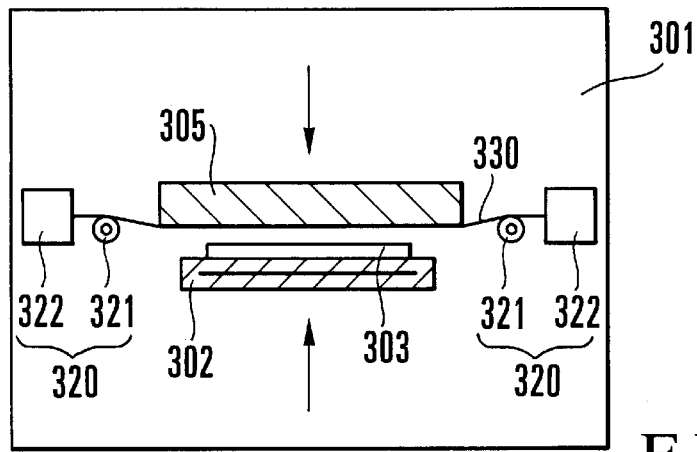
Figure 7C:
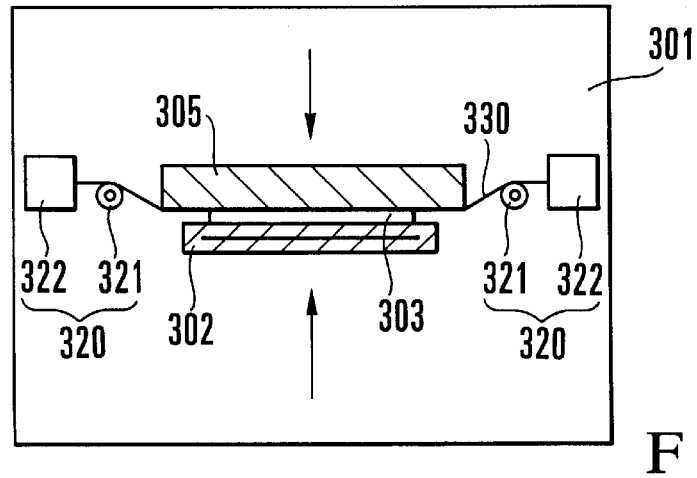

FIGS. 7A to 7C show still another embodiment of the present invention.

In this embodiment, a specimen holder 302 and a transfer plate 305 are arranged to be movable in the vertical direction. The transfer plate 305 is moved downward to press a sheet film 330, and the specimen holder 302 is moved upward to press a wafer 303 against the sheet film 330. Even with this arrangement for moving both the transfer plate 305 and the wafer 303, the same effect as in the above embodiment can be obtained. In addition, since the operation of applying a tensile force to the sheet film 330 and the pressurizing operation can be independently performed, an advantage can be obtained from the viewpoint of controllability.

[Fourth Embodiment]

The fourth embodiment of the present invention will be described below with reference to FIGS. 8 to 10D.

Figure 8:
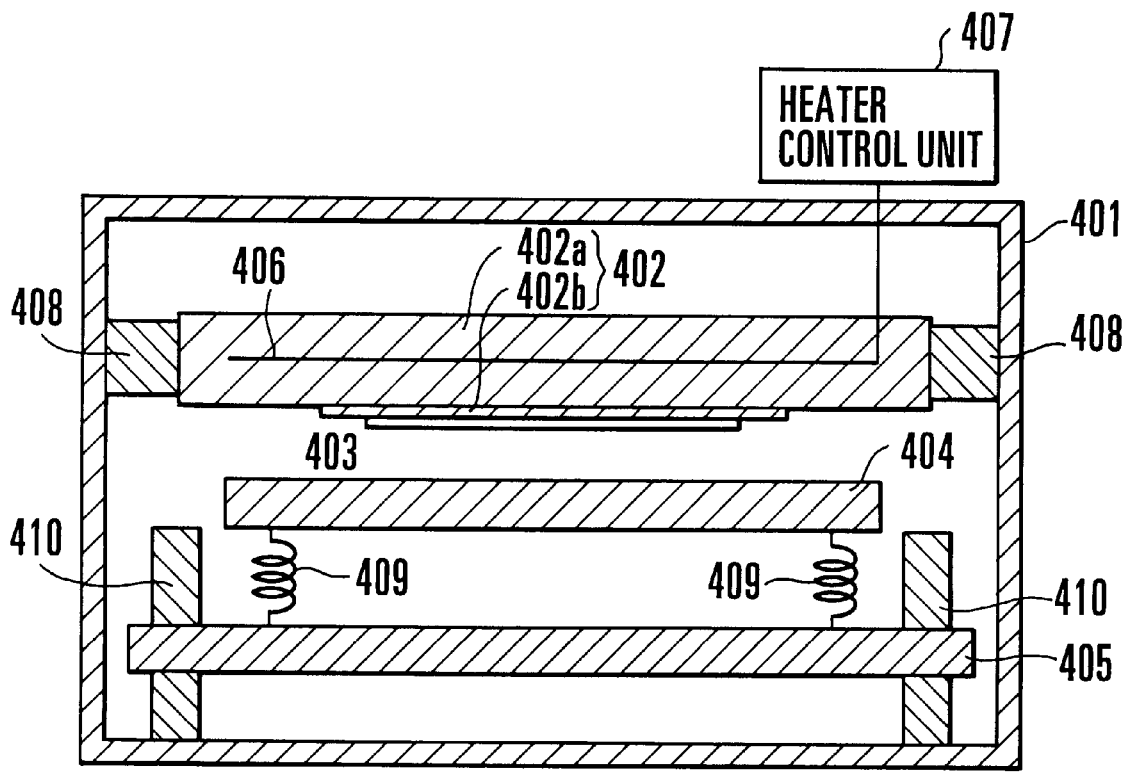
FIG. 8 is a view showing a thin film forming apparatus according to the fourth embodiment of the present invention.

As shown in FIG. 8, a specimen holder 402 for fixing a wafer (semiconductor substrate) 403 directed downward, a transfer plate 404 opposing the specimen holder 402, and a transfer plate supporting plate 405 which supports the transfer plate 404 during movement are arranged in a thin film forming chamber 401 capable of being vacuum-exhausted. The thin film forming chamber 401 is vacuum-exhausted by a vacuum exhausting means (not shown).

The specimen holder 402 is constituted by a heating table 402a and a stage 402b consisting of quartz on which the wafer 403 is placed. Quartz contains no substances contaminating the wafer 403 and can easily obtain a necessary planarity because of its good workability, and therefore, is suitable as the material of the table (stage) on which the wafer 403 is fixed.

The heating table 402*a* comprises a heater 406 as a heating system. The heater 406 is controlled by a heater control unit 407 within the range of 0° C. to 300° C. According to this thin film forming apparatus, the wafer 403 fixed on the specimen holder 402 can be heated. The specimen holder 402 is fixed in the thin film forming chamber 401 through supporting rods 408.

The transfer plate 404 is coupled to the transfer plate supporting plate 405 with springs 409 so that the transfer plate 404 can be uniformly pressurized. The transfer plate supporting plate 405 is arranged to move the transfer plate 404 toward the specimen holder 402, i.e., upward. The transfer plate supporting plate 405 is held by columns 410 for translating the transfer plate 404.

A sheet film on which a thin film has been formed in advance is fixed on the transfer plate 404 while directing the surface having the thin film upward. A polished quartz plate is arranged on the transfer plate 404 at the surface on which the sheet film is fixed, thereby ensuring a planarity. The sheet film is fixed at two ends of the quartz plate.

When the transfer plate 404, i.e., the transfer plate supporting plate 405 is pressed upward, the thin film formation surface of the sheet film on the transfer plate 404 and the thin film formation surface of the wafer 403 fixed on the specimen holder 402 can be brought into contact with each other.

When an external pressure motor is connected to the transfer plate supporting plate 405 through a pressure driving unit, the sheet film sandwiched between the transfer plate 404 and the specimen holder 402 and contacting the wafer 403 can be pressurized from the lower surface.

When a pressure sensor or the like is arranged on the rear surface (upper portion) of the specimen holder 402 to measure the pressure applied to the specimen holder 402 upward, overpressurizing or the like can be prevented.

For the illustrative convenience, the pressure motor, the pressure sensor, and a pressure control unit are omitted in FIG. 8.

Formation of a dielectric film using the above-described thin film forming apparatus will be described below.

The materials and structures of the sheet film used in this embodiment, the thin film (dielectric film) formed on the sheet film, and the wafer 403 are identical to those of the first embodiment.

Figure 9:
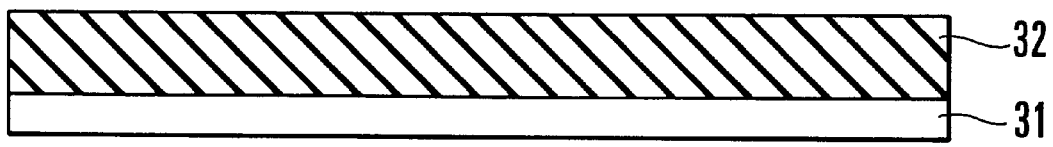
FIG. 9 is a sectional view showing a sheet film on which a thin film is formed.

FIG. 9 shows the section of the sheet film on which a thin film (dielectric film) is formed.

More specifically, a thermoplastic synthetic resin film is used as a sheet film 31. A silica-based dielectric film formation coating solution containing one or more polysilazanes as SOG materials represented by formula (1) is applied to the surface of the sheet film 31, thereby forming a coating film 32 having a thickness of about 1 $\mu$m. When the coating film (thin film) 32 is converted into a dielectric film by annealing.

Figure 10A:
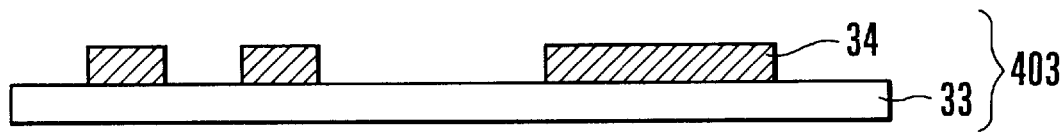
FIGS. 10A to 10D are sectional views showing a process of transferring a dielectric film to a semiconductor substrate.

For the wafer 403, an aluminum film having a thickness of 500 nm is formed on a semiconductor substrate 33 by sputtering and patterned by known photolithography and dry etching, thus forming an interconnection 34, as shown in FIG. 10A.

Figure 10B:
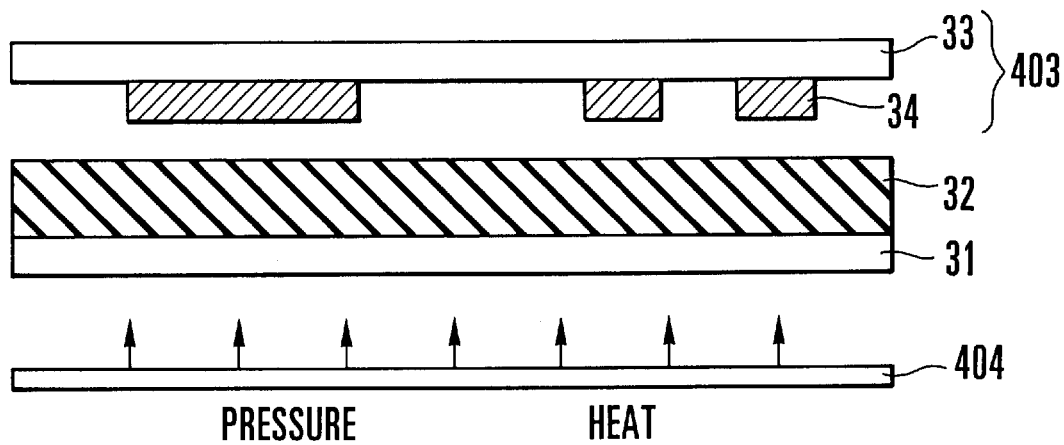

As shown in FIG. 10B, the sheet film 31 and the semiconductor substrate 33 (wafer 403 in FIG. 8) are arranged to oppose each other such that the surface having the coating film 32 and the surface having the interconnection layer 34 opposes. For the ambient, the degree of vacuum is set at 10 Torr or less. Under a low pressure, degassing from the coating film 32 formed on the sheet film 31 can be efficiently performed.

The surface having the coating film 32 and the surface having the interconnection 34 are brought into contact with each other. A pressure of 5 kg is applied from the lower surface of the sheet film 31 using the transfer plate 404 having the heating system, thereby pressing the coating film 32 on the sheet film 31 against the surface of the semiconductor substrate 33, on which the interconnection 34 is formed. Simultaneously, the sheet film 31 is heated to 130° C. for 10 minutes. As a result, the coating film 32 is transferred to the surface of the semiconductor substrate 33.

Figure 10C:
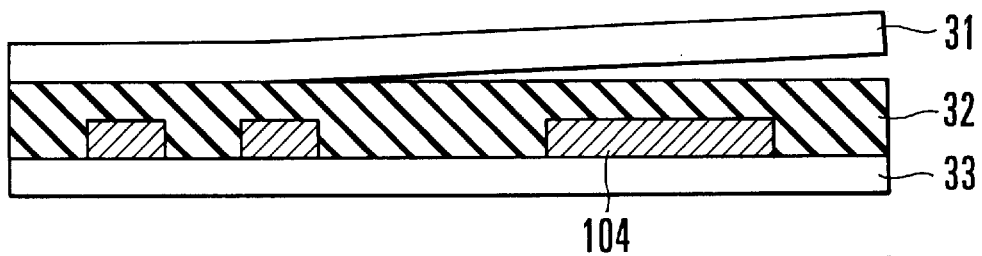
Figure 10D:
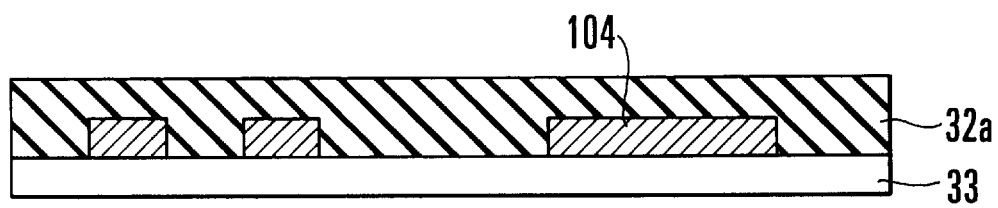

Next, the ambient is set at the atmospheric pressure while the sheet film 31 is placed on the surface of the semiconductor substrate 33 through the coating film 32. As shown in FIG. 10C, the sheet film 31 is peeled off from the coating film 32. Thereafter, the coating film 32 is annealed. As a result, a dielectric film 32*a* having a thickness of 1.0 $\mu$m and a planarized surface is formed on the semiconductor substrate 33 to cover the interconnection 34, as shown in FIG. 10D.

As described above, according to this embodiment, bonding of the sheet film is performed while the thin film formation surface of the sheet film is directed upward. With this arrangement, the thickness of the thin film on the sheet film is uniformly held. Therefore, the degassing amount does not change due to thickness variations, the sheet film 31 can be prevented from deflecting, and no transfer failure occurs.

In the above embodiment, the present invention is applied to a semiconductor substrate. However, as far as the thin film is associated with electronic components, the present invention can be applied to a substrate associated with multi-chip-module or a liquid crystal panel, as a matter of course.

[Fifth Embodiment]

The fifth embodiment of the present invention will be described next with reference to FIG. 11.

Figure 11:
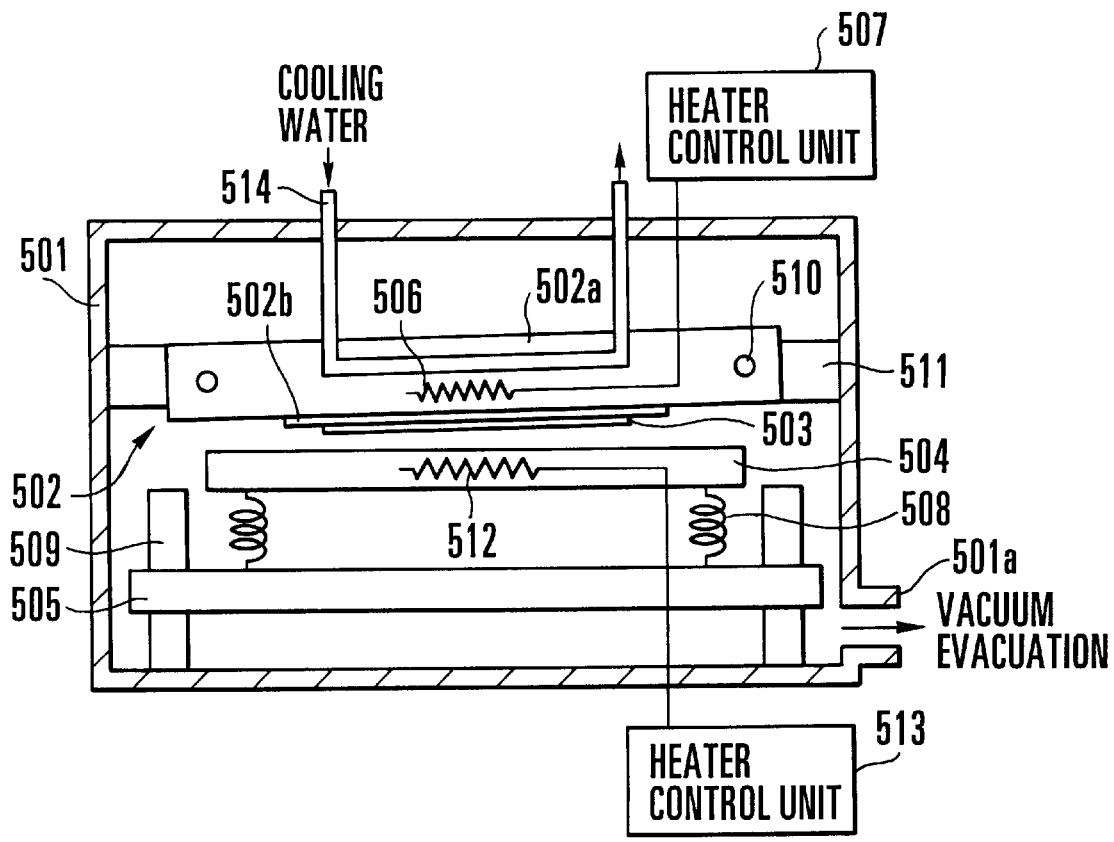
FIG. 11 is a view showing a thin film forming apparatus according to the fifth embodiment of the present invention.

As shown in FIG. 11, in a thin film forming apparatus, a specimen holder 502 for fixing a wafer 503 with its surface directed downward, a transfer plate 504 opposing the specimen holder 502, and a transfer plate supporting plate 505 which supports the transfer plate 504 during movement are arranged in a thin film forming chamber 501 capable of being vacuum-exhausted. The thin film forming chamber 501 is vacuum-exhausted by a vacuum exhausting means (not shown) through an exhaust port 501*a*.

The specimen holder 502 is constituted by a heating table 502*a* and a stage 502*b* consisting of quartz on which the wafer 503 is placed. Quartz contains no substances contaminating the wafer 503 and can easily obtain a necessary planarity because of its good workability, and therefore, is suitable as the material of the table (stage) on which the wafer 503 is fixed.

The heating table 502*a* comprises a heater 506 as a heating system. The heater 506 is controlled by a heater control unit 507 within the range of 25° C. to 300° C.

The transfer plate 504 is coupled to the transfer plate supporting plate 505 with springs 508 so that the transfer plate 504 can be uniformly pressurized. The transfer plate supporting plate 505 is arranged to move the transfer plate 504 toward the specimen holder 502.

The transfer plate supporting plate 505 is held by columns 509 for translating the transfer plate 504. Although not illustrated, the columns 509 are arranged at the four corners of the transfer plate 504.

A sheet film on which a thin film has been formed in advance is fixed on the transfer plate 504 while directing the surface having the thin film upward. A polished quartz plate is arranged on the transfer plate 504 at the surface on which the sheet film is fixed, thereby ensuring a planarity. The sheet film is fixed at two ends of the quartz plate.

The specimen holder 502 is held to be not parallel but tilted with respect to the surface of the transfer plate 504. The specimen holder 502 is supported by supporting rods 510 arranged to be symmetrical about the specimen holder 502. The supporting rods 510 are arranged at positions separated from the transfer plate supporting plate 505 by different distances. The supporting rods 510 are fixed to a specimen holder receiving plate 511 fixed in the thin film forming chamber 501. The supporting rods 510 may be directly fixed to the wall of the thin film forming chamber 501 as far as the specimen holder 502 is fixed at a tilt.

The specimen holder 502 is tilted with respect to the transfer plate 504. With this arrangement, when the transfer plate 504 is moved upward, and as shown in FIG. 4, the specimen holder 502 and the transfer plate 504 are brought into contact from the left side of the drawing, the contact area extends to the right side as the transfer plate 504 is moved upward.

As described above, the specimen holder 502 is tilted. A sheet film is placed on the surface of the transfer plate 504, and in this state, the transfer plate supporting plate 505 is moved upward to press the sheet film on the transfer plate 504 against the wafer 503. At this time, the direction of removing the gas generated between the wafer 503 and the sheet film can be kept unchanged, so that the gas can be removed in one direction.

The transfer plate 504 has a heater 512. The transfer plate 504 can be heated under the control of a heater control unit 513. The heating temperature can be controlled within the range of 25° C. to 300° C.

The specimen holder 502 has a water channel 514 so that the specimen holder 502 can be cooled by flowing cooling water in the water channel 514. The cooling temperature can be controlling within the range of 10° C. to 25° C.

When the transfer plate 504 is heated by the heating system, degassing from the thin film formed on the sheet film can be prompted, so that a transfer failure due to bubble generated upon degassing in transfer can be prevented.

The cooling system is also arranged. For this reason, by cooling the structure after transfer, local shrinkage takes place at the interface between the sheet film and the thin film. This degrades contact between the sheet film and the thin film, enabling easier peel off. In an apparatus having no cooling system, the sheet film is peeled off by spontaneous cooling. However, when the cooling system is arranged, peel off can be intentionally controlled, and the process time can be shortened.

As described above, in the thin film forming apparatus of this embodiment as well, the sheet film can be placed on the wafer while the thin film formation surface of the sheet film is directed upward. With this arrangement, the thickness of the thin film on the sheet film is uniformly held. Therefore, the degassing amount does not change due to thickness variations, the sheet film can be prevented from deflecting, and no transfer failure is generated.

For the illustrative convenience, a pressure motor, a pressure sensor, and a pressure control unit are omitted in FIG. 11.

The transfer plate supporting plate 505 may be connected to a pressure motor (not shown) arranged outside the thin film forming chamber 501 through a pressure driving unit, and a pressure up to, e.g., 20 kgw may be applied to the transfer plate supporting plate 505 by driving the pressure motor.

With this arrangement, when the specimen holder supporting plate 505 is moved upward and pressed against the wafer 503, a pressure can be uniformly applied from the lower surface of the sheet film contacting the wafer 503.

A pressure sensor may be arranged on the rear surface (upper portion) of the specimen holder 502 to detect the pressure applied to the specimen holder 502. With this arrangement, e.g., overpressurizing to the transfer plate 504 by the pressure motor or the like can be prevented.

[Sixth Embodiment]

The sixth embodiment will be described below with reference to FIGS. 12 to 17.

Figure 12:
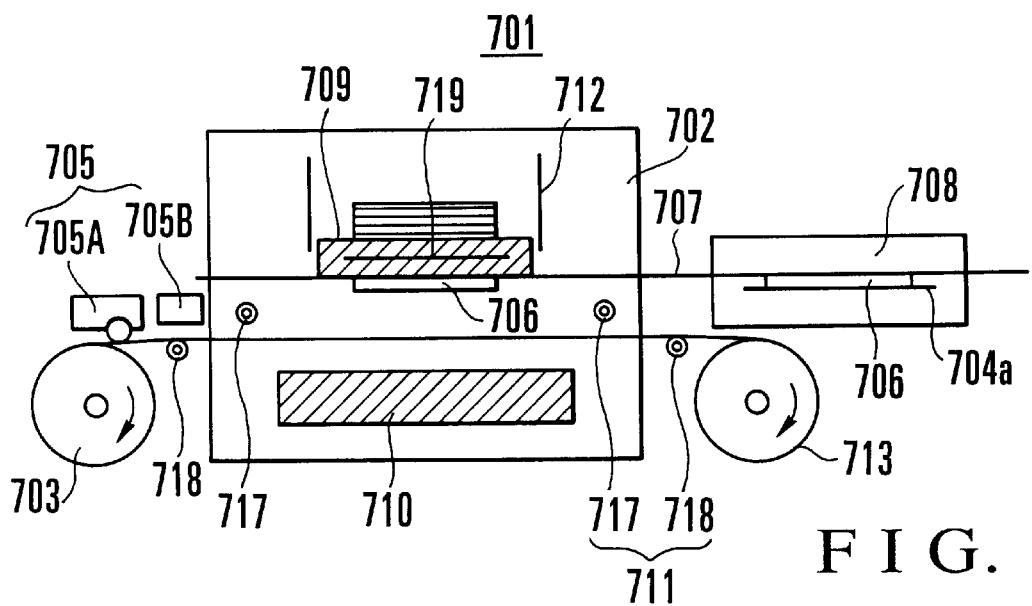
FIG. 12 is a view showing a thin film forming apparatus according to the sixth embodiment of the present invention.
Figure 13:
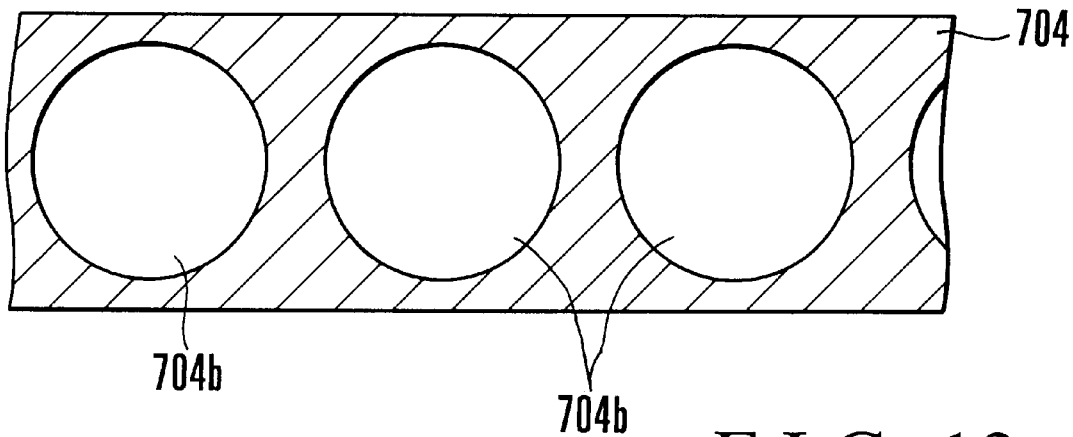
FIG. 13 is a plan view of a sheet film.

FIG. 12 shows a thin film forming apparatus according to this embodiment. FIG. 13 shows a sheet film.

A thin film forming apparatus 701 shown in FIG. 12 will be described first. A sheet film supply unit 703 is arranged outside a thin film forming chamber 702, and a sheet film 704 is supplied from the sheet film supply unit 703. A thin film is formed on the upper surface of the supplied sheet film 704 by a coating system 705. The coating system 705 has a coating unit 705A and a drying unit 705B.

A wafer 706 is carried into the thin film forming chamber 702 by a carrying system 707. A film portion 704a remaining on the surface of the wafer 706 which has been subjected to transfer and carried by the carrying system 707 is peeled off by a peeling system 708.

The sheet film 704 from which the film portion 704a is removed upon thin film transfer is collected by a sheet film collection unit 713.

The thin film forming chamber 702 comprises a specimen holder 709, a transfer plate 710, a sheet film supporting system 711, and a cutting system 712 for cutting the film portion 704a where the thin film has been transferred to the wafer in thin film transfer.

In the above arrangement, the thin film forming chamber 702 is exhausted by a vacuum pump (not shown). The sheet film supply unit 703 is constituted by a supply reel arranged on the left side of the thin film forming chamber 702 in FIG. 12. The sheet film collection unit 713 is constituted by a take-up reel arranged on the opposite side of the supply reel with respect to the thin film forming chamber 702.

The sheet film 704 having a roll shape is intermittently supplied from the supply reel in accordance with intermittent rotation of the take-up reel. A thin film is applied on the surface of the sheet film 704 by the coating system 705. The sheet film 704 is heated and dried, and then, supplied into the thin film forming chamber 702. After the thin film is transferred to the wafer 706, the sheet film 704 is wound on the take-up reel of the sheet film collection unit 713.

The sheet film 704 is supported by the sheet film supporting system 711 and applied with a predetermined tensile force. The sheet film supporting system 711 is constituted by rotating shafts 717 and tension rollers 718 for applying a predetermined tensile force to the sheet film 704. The rotating shafts 717 the vertical direction. In thin film transfer, the rotating shafts 717 are moved downward independently of or together with the specimen holder 709 and pressed against the sheet film 704. When a tensile force is applied to the sheet film 704 by the sheet film supporting system 711, the sheet film 704 can be extended and therefore prevented from deflecting in thin film transfer.

The carrying system 707 is constituted by, e.g., a conveyor belt for moving the wafer 706 while directing the thin film formation surface downward. The carrying system 707 carries the wafer 706 onto the wafer 706. When the thin film is transferred to the wafer 706 on the specimen holder 709, the carrying system 707 delivers the wafer 706 to the peeling system 708.

The specimen holder 709 has a heating means 719 for heating the wafer 706 fixed on the lower surface and moves independently of or together with the rotating shafts 717 of the sheet film supporting system 711. The heating temperature of the heating means 719 can be controlled within the range of 25° C. to 300° C.

The transfer plate 710 is arranged under the specimen holder 709 to oppose the specimen holder 709 while sandwiching the sheet film 704 therebetween. The transfer plate 710 is movable in the vertical direction. In thin film transfer, the transfer plate 710 is moved upward to press the sheet film 704 against the thin film formation surface of the wafer 706, thereby transferring the thin film.

The sheet film 704 after thin film transfer is peeled off from the wafer 706 by the peeling system 708 and collected in a collection unit (not shown). At this time, a circular portion 704b of the sheet film 704 has been cut by the cutting system 712, so the thin film at that portion is not present anymore, as shown in FIG. 13.

For the illustrative convenience, a heater control unit, a pressure motor, a pressure sensor, and a pressure control unit are omitted in FIGS. 12 and 14 to 17.

The thin film forming operation of the thin film forming apparatus having the above arrangement will be described below on the basis of FIGS. 12 and 14 to 17.

First, the wafer 706 is supplied into the chamber and fixed on the specimen holder 709 while directing the thin film formation surface downward. The thin film forming chamber 702 is vacuum-exhausted, and the heater 719 is heated.

The sheet film 704 is supplied from the sheet film supply unit 703, a thin film is formed on the surface of the sheet film 704 by the coating system 705, and the sheet film 704 is guided into the thin film forming chamber 702. A predetermined tensile force is applied by the sheet film supporting system 711 to the sheet film 704 guided into the thin film forming chamber 702, so that the sheet film 704 is made taut.

Figure 14:
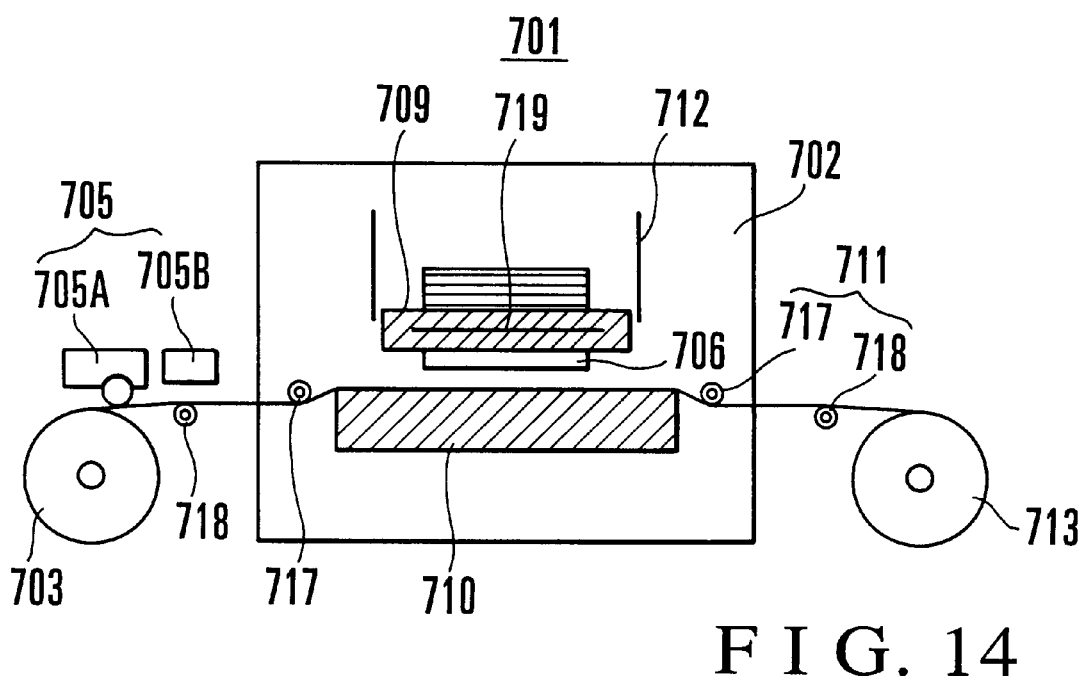
FIG. 14 is a view for explaining the operation of the thin film forming apparatus according to the sixth embodiment.

To transfer the thin film formed on the sheet film 704 to the wafer 706, the transfer plate 710 is moved upward and brought into contact with the lower surface of the sheet film 704, as shown in FIG. 14. In addition, the specimen holder 709 and the rotating shafts 717 of the sheet film supporting system 711 are moved downward together or independently, thereby pressing the rotating shafts 717 against the sheet film 704.

Figure 15:
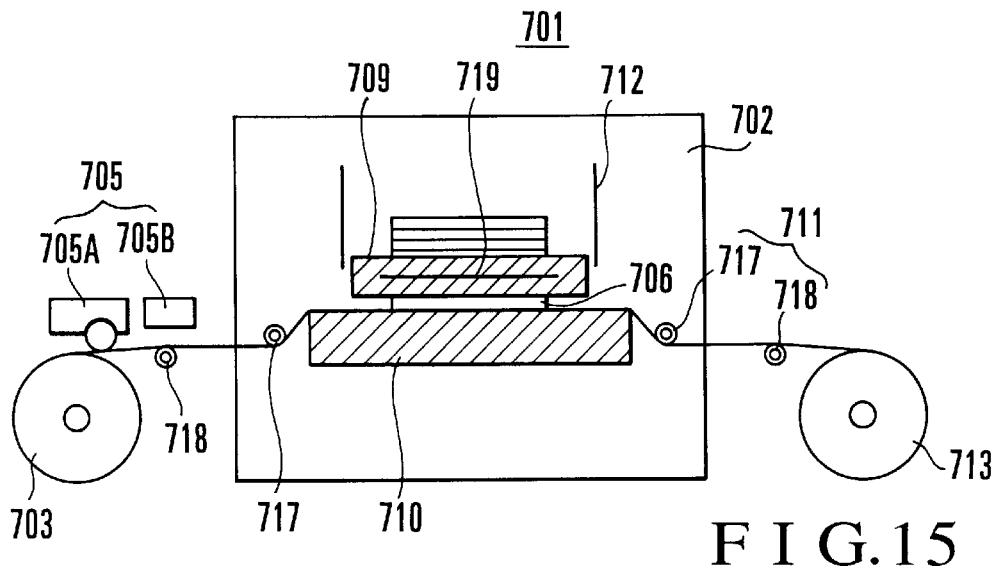
FIG. 15 is a view for explaining the operation of the thin film forming apparatus according to the sixth embodiment.

As shown in FIG. 15, the transfer plate 710 is moved upward to uniformly extend the sheet film 704. When the sheet film 704 is pressed against the lower surface of the wafer 706, the thin film formed on the sheet film 704 is transferred to the wafer 706.

Since the thin film formation of the sheet film 704 is directed upward, the thickness of the thin film on the sheet film 704 is uniformly held. As a result, the degassing amount does not change due to thickness variations. In addition, a predetermined tensile force is applied to the sheet film 704 by the sheet film supporting system 711. Therefore, the sheet film 704 can be prevented from deflecting, so that the thin film cane be reliably transferred to the wafer 706 as a flat film. Furthermore, since the size of the sheet film 704 can be arbitrarily changed, thin film transfer to a large-size wafer 706 can be performed.

Figure 16:
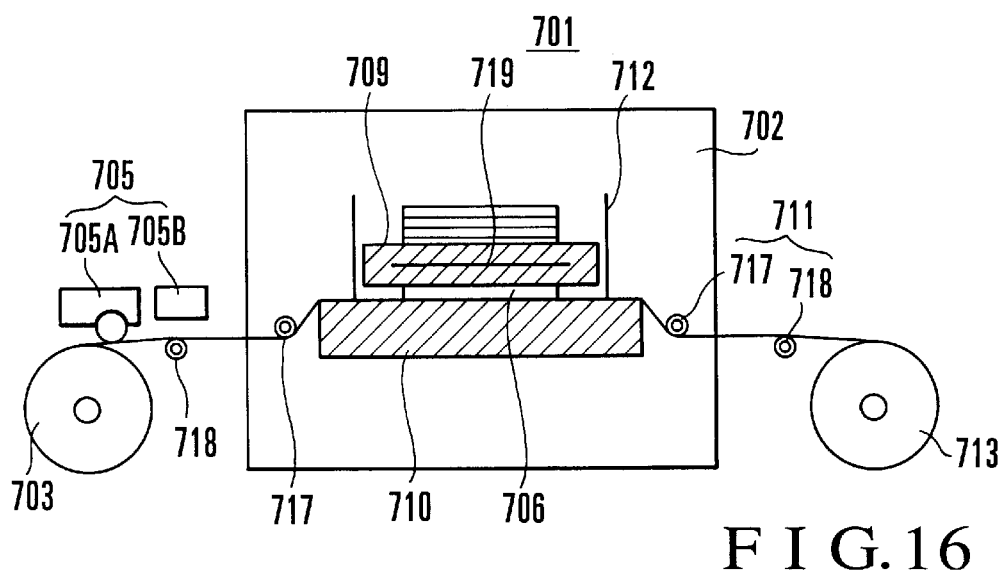
FIG. 16 is a view for explaining the operation of the thin film forming apparatus according to the sixth embodiment.

In thin film transfer, the film portion 704a where the thin film has been transferred to the wafer 706 is cut by the cutting system 712, as shown in FIG. 16. A method of, e.g., burning off the film portion 704a can be employed as a cutting method. In this embodiment, however, a rotary cutter is used to prevent contamination of the vacuum-exhausted and decompressed ambient. To enable continuous transfer, the film portion 704a is removed not to cut off the sheet film 704. In this embodiment, the film portion 704a has a circular shape larger than the wafer 706, as shown in FIG. 13.

At this time point, the film portion 704a contacts the lower surface of the wafer 706 through the transferred thin film.

Figure 17:
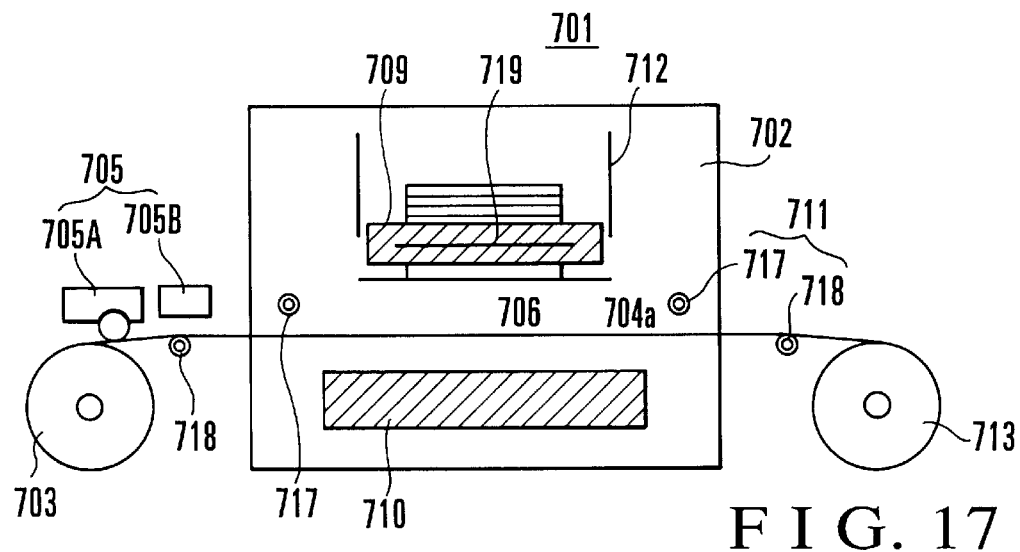
FIG. 17 is a view for explaining the operation of the thin film forming apparatus according to the sixth embodiment.

After the film portion 704a is cut, the transfer plate 710 and the specimen holder 709 are respectively moved in reverse directions to those in transfer and returned to their initial positions, as shown in FIG. 17.

Thereafter, the vacuum state in the thin film forming chamber 702 is canceled, and the wafer 706 on the specimen holder 709 is delivered from the thin film forming chamber 702 and guided to the peeling system 708 by the carrying system 707 shown in FIG. 12. The film portion 704a is peeled off from the wafer 706 and collected by a collection unit. The sheet film 704 after the film portion 704a where the thin film has been transferred is removed is collected by the sheet film collection unit 713.

By repeating the above-described operation, thin films can be continuously transferred to the wafers 706.

In this embodiment, both the transfer plate 710 and the specimen holder 709 are movable in the vertical direction. However, the present invention is not limited to this. Even when one of the transfer plate 710 and the specimen holder 709 is moved to press the sheet film 704 against the wafer 706, the thin film can be transferred, as a matter of course.

According to the sixth embodiment, bonding of the sheet film and the wafer can be performed while the thin film formation surface of the sheet film is directed upward. With this arrangement, the thickness of the thin film on the sheet film can be uniformly held. Therefore, the degassing amount does not change due to thickness variations, the sheet film can be prevented from deflecting, and no transfer failure occurs.

In addition, since the sheet film is kept taut, a transfer failure due to deflection of the sheet film is unlikely to occur.

Furthermore, since the size of the sheet film can be arbitrarily changed, thin film transfer to a large-size wafer can be performed.

In the above embodiments, a sheet film consisting of a thermoplastic synthetic resin film is used. However, the present invention is not limited to this. A metallic film or a flat plate may be used, as a matter of course.

In the above embodiments, a dielectric film is formed on the sheet film. However, any thin film other than the dielectric film can be used as far as it can be formed on the sheet film. For example, a metallic thin film may be used, as a matter of course.

What is claimed is:

1. A thin film forming method of transferring a thin film formed on a sheet film to a substrate using a transfer plate, where said thin film is a film of insulating material, comprising:

the first step of making said transfer plate contact a rear surface of said sheet film;

the second step of making a surface as a thin film formation surface of said substrate contact a surface of said sheet film;

the third step of pressing said sheet film against said substrate to transfer said thin film to said surface of said substrate; and the fourth step of peeling off said sheet film after said thin film is transferred to said surface of said substrate.

2. A method according to claim 1, wherein the first step includes arranging said sheet film while directing said surface upward, and the second step includes making said surface as said thin film formation surface of said substrate contact said surface of said sheet film while directing said thin film formation surface downward.

3. A method according to claim 1, wherein, in the second step, when said substrate is brought into contact with said thin film formed on said sheet film, said substrate and said thin film start to contact at a predetermined position, and a contact area therebetween extends in a predetermined direction.

4. A method according to claim 1, wherein the second step includes applying a tensile force to said sheet film when said substrate is brought into contact with said thin film formed on said sheet film.

5. A method according to claim 1, wherein the second step is performed in a vacuum-exhausted ambient.

6. A method according to claim 1, wherein the third step includes pressing said substrate against said transfer plate at a predetermined pressure and simultaneously heating one of said substrate and said sheet film, thereby transferring said thin film to said substrate.

7. A method according to claim 1, wherein said substrate is pressed against said transfer plate at a predetermined pressure, and simultaneously said substrate and said sheet film are heated, thereby transferring said thin film to said substrate.

8. A thin film forming method of transferring a thin film formed on a sheet film to a semiconductor substrate using a transfer plate wherein said thin film is a film of insulating material, comprising the steps of:

forming said thin film on a said sheet film;

supplying said sheet film having said thin film into a thin film forming chamber;

applying a tensile force to said sheet film and pressing said sheet film against said semiconductor substrate to transfer said thin film to said semiconductor substrate;

cutting a film portion pressed against said semiconductor substrate; and peeling off said cut film portion from said semiconductor substrate.

9. A method according to claim 8, wherein said sheet film is arranged on said transfer plate while directing a surface having said thin film upward, and said substrate contacts said surface of said sheet film while directing a surface as a thin film formation surface downward.

10. A method according to claim 6, wherein transferring said thin film to said substrate includes adapting said thin film to the contour of said substrate.

* * * * *

UNITED STATES PATENT AND TRADEMARK OFFICE
CERTIFICATE OF CORRECTION

PATENT NO.   :   5,972,780
DATED        :   October, 26, 1999
INVENTOR(S)  :   Machida et al.

It is certified that error appears in the above-identified patent and that said Letters Patent is hereby corrected as shown below:

Item [73], Assignee, please delete "Telegraph Telephone" and insert --Telegraph and Telephone--.

Item [56], References Cited, Attorney, Agent, or Firm, please delete "Blakey" and insert --Blakely--.

Signed and Sealed this

Fifteenth Day of May, 2001

Attest:

NICHOLAS P. GODICI

Attesting Officer         Acting Director of the United States Patent and Trademark Office